(12) United States Patent
Alferness et al.

(10) Patent No.: US 6,754,879 B1
(45) Date of Patent: Jun. 22, 2004

(54) METHOD AND APPARATUS FOR PROVIDING MODULARITY TO A BEHAVIORAL DESCRIPTION OF A CIRCUIT DESIGN

(75) Inventors: Merwin H. Alferness, New Brighton, MN (US); Mark D. Aubel, Essex Jct., VT (US); Frederick H. Hathaway, St. Paul, MN (US)

(73) Assignee: Unisys Corporation, Blue Bell, PA (US)

( * ) Notice: Subject to any disclaimer, the term of this patent is extended or adjusted under 35 U.S.C. 154(b) by 1060 days.

(21) Appl. No.: 08/789,702

(22) Filed: Jan. 27, 1997

(51) Int. Cl.⁷ ............................. G06F 17/50; G06F 9/45
(52) U.S. Cl. ................... 716/8; 716/9; 716/10; 716/11; 716/12; 716/13; 716/14
(58) Field of Search ................. 364/488, 489, 364/490, 491; 716/8–14

(56) References Cited

U.S. PATENT DOCUMENTS

| | | | |
|---|---|---|---|
| 4,580,228 A | 4/1986 | Noto ......................... | 364/491 |
| 4,686,629 A | 8/1987 | Noto et al. ................. | 364/491 |
| 4,758,953 A | 7/1988 | Morita et al. ............... | 364/300 |
| 4,815,003 A | 3/1989 | Putatunda et al. ........... | 364/491 |
| 4,831,543 A | 5/1989 | Mastellone .................. | 364/489 |
| 4,918,614 A | 4/1990 | Modarres et al. ........... | 364/490 |
| 5,050,091 A | 9/1991 | Rubin ........................ | 364/488 |
| 5,164,908 A | 11/1992 | Igarashi ...................... | 364/491 |
| 5,175,696 A | 12/1992 | Hooper et al. .............. | 364/489 |
| 5,222,029 A | 6/1993 | Hooper et al. .............. | 364/489 |
| 5,224,056 A | 6/1993 | Chene et al. ............... | 364/490 |
| 5,237,514 A | 8/1993 | Curtin ....................... | 364/490 |
| 5,255,363 A | 10/1993 | Seyler ........................ | 395/164 |
| 5,257,363 A * | 10/1993 | Shapiro et al. ............. | 395/500 |
| 5,267,175 A | 11/1993 | Hooper ....................... | 364/489 |
| 5,267,176 A | 11/1993 | Antreich et al. ............. | 364/491 |
| 5,278,769 A * | 1/1994 | Bair et al. ................... | 364/490 |
| 5,311,443 A | 5/1994 | Crain et al. ................. | 364/491 |
| 5,341,309 A | 8/1994 | Kawata ....................... | 364/489 |
| 5,349,536 A | 9/1994 | Ashtaputre et al. ......... | 364/491 |
| 5,349,659 A | 9/1994 | Do et al. .................... | 395/700 |
| 5,355,317 A | 10/1994 | Talbott et al. .............. | 384/468 |
| 5,357,440 A | 10/1994 | Talbott et al. .............. | 364/467 |
| 5,359,523 A | 10/1994 | Talbott et al. .............. | 364/468 |
| 5,359,537 A | 10/1994 | Saucier et al. .............. | 364/489 |
| 5,361,357 A | 11/1994 | Kionka ....................... | 395/700 |
| 5,363,313 A | 11/1994 | Lee ............................ | 364/491 |
| 5,398,195 A | 3/1995 | Kim ........................... | 364/491 |
| 5,406,497 A | 4/1995 | Altheimer et al. ........... | 364/489 |
| 5,416,721 A | 5/1995 | Nishiyama et al. .......... | 364/491 |
| 5,418,733 A | 5/1995 | Kamijima .................... | 364/490 |
| 5,418,954 A | 5/1995 | Petrus ........................ | 395/700 |
| 5,440,720 A | 8/1995 | Baisuck et al. ............. | 395/500 |

(List continued on next page.)

OTHER PUBLICATIONS

Carl Sechen, "VLSI Placement and Global Routing Using Simulated Annealing", Kluwer Academic Publishers, 1988, pp. 1–19.

R. E. Massara, Ed. "Design and Test Techniques for VLSI and WSI Circuits", Peter Peregrinus, Ltd., 1989, pp. 14–27.

*Primary Examiner*—Hugh Jones
(74) *Attorney, Agent, or Firm*—Charles A. Johnson; Mark T. Starr; Nawrocki, Rooney & Sivertson, P.A.

(57) ABSTRACT

A method and apparatus for selectively providing modularity and/or hierarchy to a behavioral description of a circuit design. This is accomplished by providing a template call in the behavioral description of the circuit design. The template call provides a reference to a corresponding template behavioral description. The behavioral description of the circuit design is expanded using an expander preprocessor, wherein a command line switch is used to selectively provide modularity and/or hierarchy to the resulting behavioral description.

9 Claims, 18 Drawing Sheets

U.S. PATENT DOCUMENTS

| | | | |
|---|---|---|---|
| 5,463,563 A | * 10/1995 | Bair et al. | 364/490 |
| 5,483,461 A | 1/1996 | Lee et al. | 364/490 |
| 5,485,396 A | 1/1996 | Brasen et al. | 364/491 |
| 5,490,266 A | 2/1996 | Sturges | 395/500 |
| 5,490,268 A | 2/1996 | Matsunaga | 395/550 |
| 5,491,640 A | 2/1996 | Sharma et al. | 364/488 |
| 5,493,508 A | 2/1996 | Dangelo et al. | 364/489 |
| 5,572,437 A | * 11/1996 | Rostoker et al. | 364/489 |
| 5,625,565 A | * 4/1997 | Van Dyke | 364/489 |
| 5,703,789 A | * 12/1997 | Beausang et al. | 364/489 |
| 5,854,926 A | * 12/1998 | Kingsley et al. | 717/5 |
| 5,987,239 A | * 11/1999 | Kirsch | 716/1 |

* cited by examiner

ILLUSTRATIVE TEMPLATE BEHAVIORAL CODE CALL

| DIRECTIVE | INSTANCE NAME | SUBSTITUTION PARAMETERS | INPUT NET PARAMETERS | OUTPUT NET PARAMETERS |
|---|---|---|---|---|
| #TEMPLATE | ABC | $A xZ | Hneta Hnetb Hnetc qclock1 qclock2 | Hout-d |

FIG. 6A

ILLUSTRATIVE TEMPLATE COMMAND FORMAT

| DIRECTIVE | INSTANCE NAME | SUBSTITUTION PARAMETERS | INPUT NET PARAMETERS | OUTPUT NET PARAMETERS |
|---|---|---|---|---|
| #EXPAND | ABC TO ABC0 | a 0 | Hnet0, Hnet1, Hnet2, ph1w, ph2 | Hout0-d |

FIG. 6B

FROM THE TEMPLATE:

136 → {#template ABC $   A %Z   (Hneta, Hnetb, Hnetc, gclock1,gclock2   -> Hout_d)
       if gclock1 then
162 →{   Hint$A_d[%Z]:=Hneta;
         Hint$A_d[%(Z+1)]:=Hnetb;
       end if;
       if gclock2 then
         Hout_d:=Hnetc and Hint$A_d[%Z,%(Z+1)];
       end if;
       {#end template}

IN THE BEHAVIOR:

150 → {#expand ABC to ABC0 with a,0 (Hnet0, Het   1, Hnet2, phlw, ph2 ->  Hout0_d)
164 ↗ {#expand ABC to ABC1 with a,2 (Hnet3, Hnet4, Hnet5, phlw, ph2 ->   Hout1_d)

FIG. 7

```
(#expand ABC to ABC0 with a0                Hinst0, Hinst1, Hinst2, phiw, ph2 -> Hout0_d))
if phiw then
    Hinta_d[0]=Hinst0;
    Hinta_d[1]=Hinst1;
end if;
if ph2 then
    Hout0_d=Hinst2 and Hinta_d[0,1]
end if;
(#ENDEXPAND ABC TO ABC0)                                    ~174

(#expand ABC to ABC1 with a2 Hinst3, Hinst4, Hinst5, phiw, ph2 -> Hout1_d))
if phiw then
    Hinta_d[2]=Hinst3;
    Hinta_d[3]=Hinst4;
end if;
if ph2 then
    Hout0_d=Hinst5 and Hinta_d[2,3];
end if;
(#ENDEXPAND ABC TO ABC 1)                                   ~184
```

FIG. 8

```
{#repeat $A=A to C step 1}
{#repeat %Z=0 to 11 step 1}
  {#expand ABC to A$A[%Z] with $A, %Z[Hnet0[%
  Hout0_d[%Z]]) Z], Hnet1[%Z], phlw, ph2 ->
{#end repeat}
{#end repeat}
```

⎯190

TEMPLATES

```
(template D with $AB[Hnet0, Hnet1, gclock1 -> Hout_d])
    Hint$(AB):=Hnet0 and Hnet1;
    if gclock1 then
        Hout_d:=Hint$(AB);
    end if;
(#end template)

(#template  E with $A, $B, $C[Hnet0, Hnet1, gclock1 -> Hout_D])
    Hint0$A:=Hnet0 and Hnet1;
    Hint1$A:=Hnet0 or Hnet1;
    Hint2$A:=Hnet0 xor Hnet1;
    Hint3$A:=Hnet0 nor Hnet1;
    (#expand D to D1 with $B[Hint0$A, Hint1$A, gclock1 -> Hint4$A])
    (#expand D to D2 with $C[Hint2$A, Hint3$A, gclock1 -> Hint5$A])
    Hout_d:=Hint4$A nand Hint5$A;
(#end template)
```

IN BEHAVIOR

```
(#expand E to E1 with A,B,C[Hnetin0, Hnetin1, ph1 -> Hout_D])
```

FIG. 10

RESULT AFTER EXPANSION

```
                 ┌─ 210
                 ▼

╱ {#expand    E to E1 with A,B,C(Hnetin0, Hnetin1, ph1 -> Hout_D)}
  212 ──╱   Hint0A:=Hnetin0 and Hnetin1;
           Hint1A:=Hnetin0 or Hnetin1;
           Hint2A:=Hnetin0 xor Hnetin1;
           Hint3A:=Hnetin0 nor Hnetin1;
           {#expand D to D1 with B(Hint0A, Hint1A, ph1 -> Hint4A)}
           HintB:=Hint0A and Hint1A;
           if ph1 then
                Hint4A:=HintB;
           end if;
          ╱{#ENDEXPAND D TO D1}
         ╱ {#expand D to D2 with C(Hint2A, Hint3A, ph1 -> Hint5A)}
  216 ──⟨  HintC:=Hint2A and Hint3A;
         ╲  if ph1 then
          ╲      Hint5A:=HintC;
           ╲ end if;
            ╲{#ENDEXPAND D TO    D2}
             Hout_D=Hint4A nand Hint5A
           ╱{#ENDEXPAND E TO    E1}
  214 ──╱
```

FIG. 11

METHOD AND APPARATUS FOR PROVIDING MODULARITY TO A BEHAVIORAL DESCRIPTION OF A CIRCUIT DESIGN

CROSS REFERENCE TO CO-PENDING APPLICATIONS

The present application is related to U.S. patent application Ser. No. 08/414,881, filed Mar. 31, 1995, entitled "A Method for Placing Logic Functions and Cells in a Logic Design Using Floor Planning by Analogy", U.S. patent application Ser. No. 08/414,881, filed Mar. 31, 1995, entitled "A Method for Placing Logic Functions and Cells in a Logic Design Using Floor Planning by Analogy", U.S. patent application Ser. No. 08/789,703, filed Jan. 27, 1997, entitled "Method and Apparatus for Selectively Providing Hierarchy to a Circuit Design", which are all assigned to the assignee of the present invention and which are all incorporated herein by reference.

BACKGROUND OF THE INVENTION

1. Field of the Invention

The present invention generally relates to methods for describing circuit designs using behavioral descriptions and more particularly relates to methods for selectively providing modularity and/or hierarchy to a behavioral description.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form.

A common method for specifying the integrated circuit design is the use of hardware description languages. This method allows a circuit designer to specify the circuit at the register transfer level (also known as a "behavior description"). Using this method, the circuit is defined in small building blocks. Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

It is often desirable to employ hierarchial design techniques to describe the appropriate selection and interconnection of logic and/or memory devices which will enable the chip to perform the desired function. Hierarchical design techniques often involve describing the chip's functionality at various levels of abstraction, ranging from the most general function performed by the chip to the precise functions performed by each logic and/or memory element on the chip.

An efficient way to store a hierarchical circuit design is to provide modularity to the circuit design database. Modularity is a term used to describe the concept of representing identical functions in the circuit design with multiple instances of a common component or module. For example, a common adder bit slice may be described using a behavioral language, and the resulting behavioral description may be stored as an adder bit slice module in a design library. When an N-bit adder is desired, the circuit designer may instantiate "N" adder bit slice modules. Each adder bit slice instance within the circuit design may reference the behavioral description for the common adder bit slice module. Providing modularity is separate from providing hierarchy to a circuit design, as modularity may be provided without providing hierarchy, and visa versa. However, typically modularity and hierarchy are provided together.

A non-modular circuit design database must typically describe each instance separately and independently. That is, and continuing with the above example, for each of the N-bit adder bit slices, a non-modular circuit design database may include "N" copies of the behavioral description for the adder bit slice module, one for each adder bit slice instance.

A modular database has a number of advantages over a non-modular database. First, the amount of data that must be stored to describe a circuit design using a non-modular database structure may be significantly higher because each instance must be independently described and stored. In a modular database structure, the description for each identical instance is typically shared.

In addition to the above, and because the description for each identical instance is typically shared, it is easier to ensure that the most current version of the corresponding behavioral description for a particular module or component is provided throughout the circuit design. For example, in a modular database, a circuit designer may modify the behavioral description for a particular shared module. That change may then be reflected in each instance of that module because the description therefor is shared. In a non-modular database, the circuit designer typically must modify the description for each instance of the module. As can readily be seen, the modification of modules in a non-modular database may be error prone and tedious.

Another advantage of providing modularity to a circuit design is that the time required to synthesize a behavioral description into a corresponding detailed description may be reduced. That is, because a number of instances may share the same behavioral description, the common behavioral description may be synthesized once, and the resulting detailed description may be shared. This is particularly useful when the common behavioral description does not include any internal nets or variables that will conflict with other instances of the same module (for example, an AND2 gate). It is recognized that the interface section of each instance of the module may have to be processed to define unique interconnect of each instance to the overall circuit design. However, this may still reduce the time required to synthesize the overall behavioral description of the circuit design. In contrast, and in non-modular databases, the behavioral description for each identical module must be independently synthesized into a number of corresponding detailed descriptions.

A number of modular behavioral description languages currently exist, including the VHSIC Hardware Description Language (VHDL). VHDL has a number of constructs, including the component construct, which allow components to be instantiated within a circuit design. Each instantiation of a component references a common behavioral description. Each instantiation of a component is essentially a procedural call to the behavioral description of the component, and thus does not incorporate the behavioral description of the components into the behavioral description of the overall circuit design.

Many hardware description languages do not allow true modularity. For example, the UDSL hardware description language available from UNISYS Corporation is essentially a non-modular hardware description language. In addition, some behavioral simulation and logic synthesis tools cannot directly read and operate on modular hardware descriptions.

It should be recognized that many design tools are typically used during the design of an integrated circuit including high level behavioral simulator tools, detailed description simulator tools, synthesis tools, logic optimizer tools, manual placement or floorplanning tools, place and route tools and verification tools. Because some but not all design tools are compatible with modular hardware description languages, it would be desirable to use both modular and non-modular compatible tools, depending on the availability and overall effectiveness of the tools. That is, it would be desirable to provide a non-modular behavioral description to those tools that are available but cannot handle modularity. Likewise, it would be desirable to provide a modular behavioral description to those tools that are available and can handle modularity. Thus, it would be advantageous to provide a behavioral description that can be selectively expanded to include modularity therein, depending on the design tools that are selected for use in the design process.

Regardless of whether a modular or non-modular behavioral language is used, the manual placement of selected cells and modules within a circuit design can be a major task. Until recently, much of the cell placement function was performed using automatic placement tools. However, because many modern integrated circuits are pushing the limits of density and performance, circuit designers are often forced to manually place a number of critical cells within the design. It is known that manual placement often provides a more optimal placement solution than an automatic placement tool.

The manual placement of modules and cells within a circuit design is particularly tedious because some synthesis tools remove the modularity and/or hierarchy that may be provided in the behavior description. Thus, the detailed description provided by the synthesis tool can typically be non-modular. Even if modularity is provided, typical manual placement tools may not recognize the modularity provided in the detailed description. Thus, when placing identical instances of a module, each instance (including those cells or modules contained within each instance) must be placed separately. Thus, and continuing with the above adder example, a circuit designer may manually place all cells and modules within a particular instance of an adder bit slice. To place another adder bit slice, however, the circuit designer may have to repeat the same placement for all cells and modules within all other instances of the adder bit slices. This makes the manual placement of many circuit designs tedious and error prone.

SUMMARY OF THE INVENTION

The present invention overcomes many of the disadvantages of the prior art by providing a method and apparatus for selectively providing modularity to a behavioral description of a circuit design. This is accomplished by providing a template for a selected portion of the circuit design. The template includes a template call and a corresponding template behavioral description. The template is instantiated in the behavioral description of the circuit design by including the template call therein. The behavioral description may then be expanded using an expander preprocessor. The expander preprocessor incorporates the behavioral description of the template into the behavioral description of the circuit design, and provides template markers to identify the location of the template. For those tools that cannot directly read hierarchical behavioral descriptions, the template markers are ignored. For those tools that can directly read hierarchical behavioral descriptions, the template markers are interpreted, and a hierarchical module corresponding to the template is provided.

When prompted, the expander preprocessor also can create a dummy module when it encounters the first expansion of a given template. This dummy module may be used by a logic synthesizer to generate a common placement module for inclusion in a placement database. During manual placement, each instance of a given template may reference the common placement module, and the manual placement tool may provide a mechanism for sharing the placement information between selected instances. Using this approach, a circuit designer may place the internal cells of a module using the manual placement tool. Because other instances of that module may share the same placement information, the internal cells of the other instances may be automatically placed by simply referencing the common placement information. This may significantly reduce the time required to place a circuit design.

In a preferred embodiment, a number of template calls are provided in a behavioral description of a circuit design. Each template call corresponds to an instantiation of a module or cell, and references a corresponding template behavioral description. Multiple instances of a particular module may reference the same template behavioral description.

The template call includes a template name, an instance name, a number of formal parameters, and the input and output nets that the template is connected to within the overall behavioral description of the circuit design. The template call is preceded by a #expand identifier, and is contained within comment delimiters for identification purposes by the expander preprocessor.

The expander preprocessor replaces the template calls with the actual text of the corresponding template behavioral description. In addition, the expander preprocessor replaces, by text substitution, the formal parameters and input/output net names within the template behavioral description with the template parameters specified in the template call. The expander preprocessor may also perform arithmetic or boolean operations to determine an appropriate value for the format parameters and/or input/output names. This effectively customizes the template behavioral description for each instantiation of the template. Finally, the expander preprocessor may provide template markers to mark the location of each template, which may be used by other tools as descried below.

When modularity and/or hierarchy is not desired, for example when a circuit designer wishes to provide the overall behavioral description of the circuit design to a tool such as an EDDE logic simulator which cannot handle modular behavioral descriptions, the expander preprocessor ignores the template markers and provides an essentially flat behavioral description. When modularity and/or hierarchy is desired, for example when a circuit designer wishes to provide the overall behavioral description of the circuit design to a tool such as a logic synthesizer that can handle modular behavioral descriptions, the expander preprocessor interprets the template markers, and a hierarchical module corresponding to the template is inserted.

In addition to the above, when prompted the expander preprocessor may generate a common template module when it encounters a first occurrence of a given template. The common template module may then be used by, for example the logic synthesizer, to provide a synthesized common template module that can be referenced by all instantiations of the given template. The logic synthesizer may synthesize the common template module, but may skip over all other instances of a given template, and simply reference the template calls to define the interconnect for each instance. This may be particularly useful when the resulting detailed description is provided to a manual placement tool, where each instance of a template may reference the same placement information of the common template module. As described above, this may significantly reduce the time required to perform manual placement of a circuit design.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 6A is a table showing an illustrative interface provided in a template behavioral description;

FIG. 6B is a table showing an illustrative template call definition that corresponds to the interface in the template behavioral description shown in FIG. 6A;

FIG. 7 shows an illustrative template behavioral description for the template call of FIGS. 6A–6B, and two template instantiations therefor.

FIG. 8 shows the illustrative template behavioral description of FIG. 7 after the expander preprocessor has substituted the parameters specified in the first template instantiation;

FIG. 10 shows an illustrative template behavioral description having nested template instantiations;

FIG. 11 shows the illustrative template behavioral description of FIG. 10 after expansion by the expansion preprocessor;

DETAILED DESCRIPTION OF THE PREFERRED EMBODIMENTS

Figure 1:
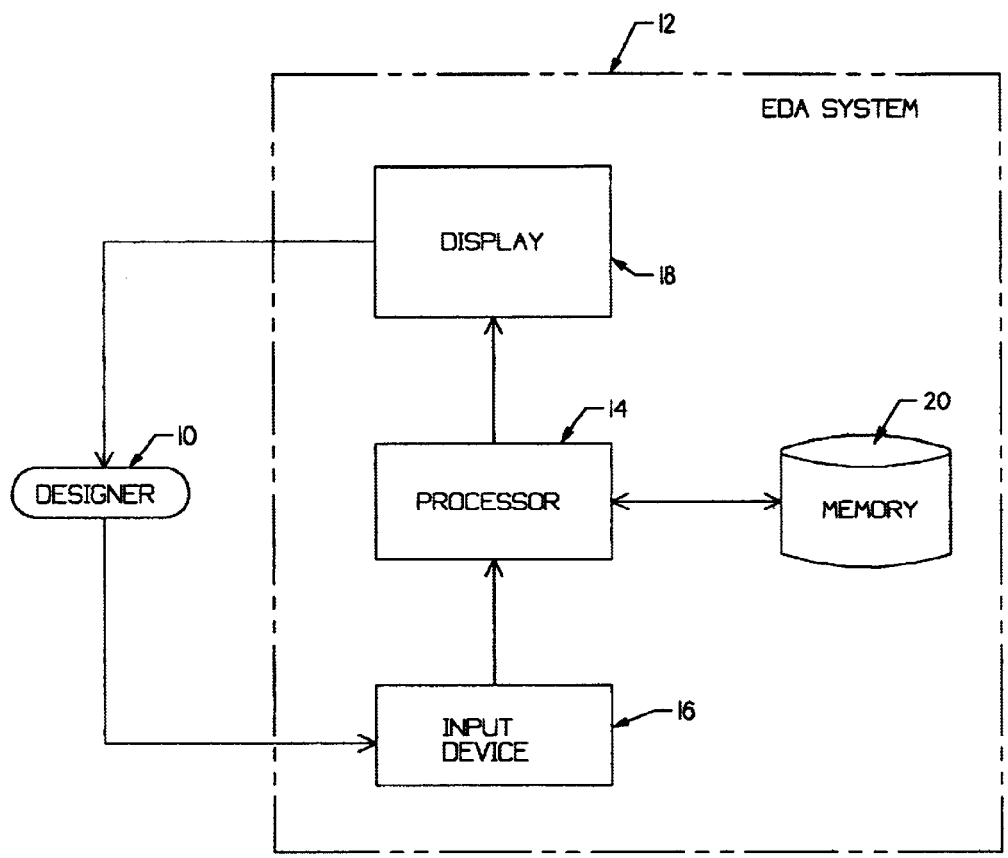
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Integrated circuit designers describe the high-level logical representation of a design in terms of equations. This logical representation is called a "behavior" description. The behavior description is simulated and verified to assure that it conforms to the desired specifications. Once the behavior description of the integrated circuit has been verified, it is transformed into a detailed description (also known as a structural or gate-level description). This conversion process is called synthesis. The detailed description represents the equation-based behavior description in the form of gate-level objects (components) and the connections (nets) between the objects. The detailed description is used for the remaining design processes. The detailed description is used to simulate the design at the gate level, establish the initial physical component placement (floor plan), complete the final physical component placement and net interconnect routing (layout), perform delay calculation and timing analysis, and generate test patterns for manufacturing verification. During these remaining design processes, there are various attribute types and attribute values attached to the detailed description. Some of these attributes are generated by the integrated circuit designer (via software tool or tools), while other attributes are generated by the EDA software system. Names of components and nets are one of the main software-generated attributes.

Physical attribute values, especially component placement and interconnect routing coordinates, are contingent upon a name-based design. In other words, each attribute and its value is associated with a given name and the object the name represents. For the physical floor-planning process, a pair of X,Y coordinates (i.e., the physical attribute and given values) are associated with each component in the design. This process is controlled by the designer, but with assistance from the EDA software. For the physical layout process, the X,Y coordinates (again, the physical attribute and given values) are also associated with a specific component and its interconnect (net). This process is usually a manual and automated process implemented by the circuit designer and EDA software.

FIG. 1 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 20. The Memory may take the form of a semiconductor memory, magnetic disks, optical disks, magnetic tape or other mass storage device.

Figure 2:
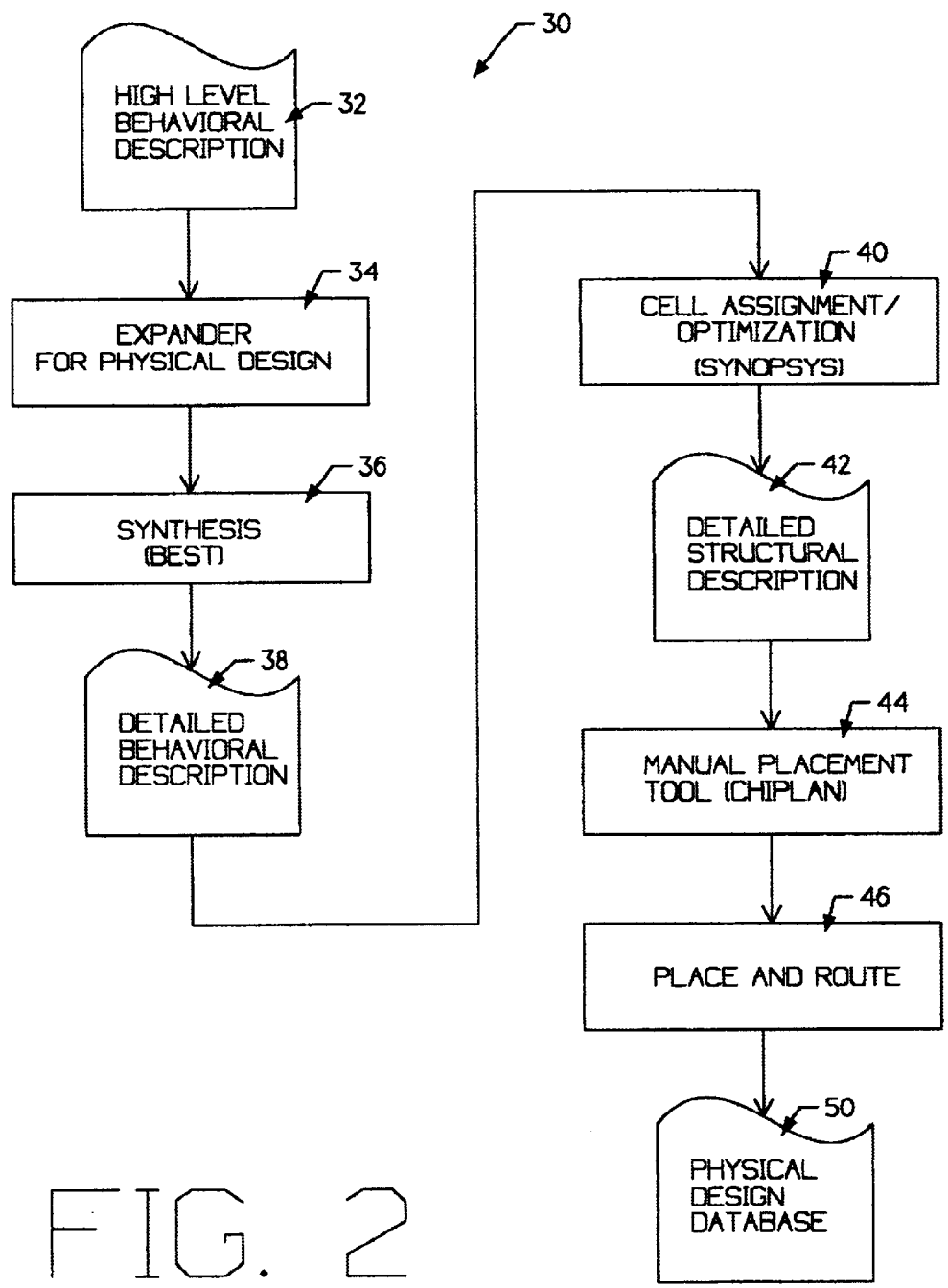
FIG. 2 is a flow diagram showing an illustrative physical design process for a circuit design.

FIG. 2 is a flow diagram showing an illustrative physical design process for a typical circuit design. The diagram is generally shown at 30. A high level behavioral description 32 is provided which includes a number of template calls. The high level behavioral description 32 is provided to an expander preprocessor, as shown at 34. In a preferred embodiment, the expander preprocessor has the capability of selectively providing modularity and/or hierarchy to the behavioral description. In the flow diagram shown in FIG. 2, the expander preprocessor expands the behavioral description for physical placement, which in this case provides modularity to the behavioral description. The resulting expanded behavioral description is provided to a logic synthesis tool 36, which generates a detailed description 38 of the circuit design. A preferred synthesis tool is the BEST tool developed by the Unisys Corporation. The BEST tool preserves the modularity introduced by the expander 34.

The detailed description 38 is then provided to a cell assignment/optimization tool 40, which assigns library components to the detailed description and optimizes the logic therein. A preferred cell assignment/optimization tool is available from Synopsys, Inc. The Synopsys tool maintains the modularity and/or hierarchy provided in the detailed behavioral description 38. The cell assignment/optimization tool provides a detailed structural description 42, which is then provided to a manual placement tool 44. A preferred manual placement tool is the Chiplan tool developed by the Unisys Corporation. The manual placement tool 44 interprets the modularity and/or hierarchy in the detailed structural description, and provides a mechanism for sharing placement information between instances. Thus, the circuit designer can place the components in one instance of a module, and all other instances of that module may be automatically placed, if desired. This may significantly reduce the time required to place a circuit design.

The manual placement tool 44 provides at least a partially placed circuit design to an automatic place and route tool 46. The automatic place and route tool 46 automatically places the remaining cells within the design, and routes the nets to interconnect the cells. The automatic place and route tool provides a physical design database, as shown at 50.

Figure 3:
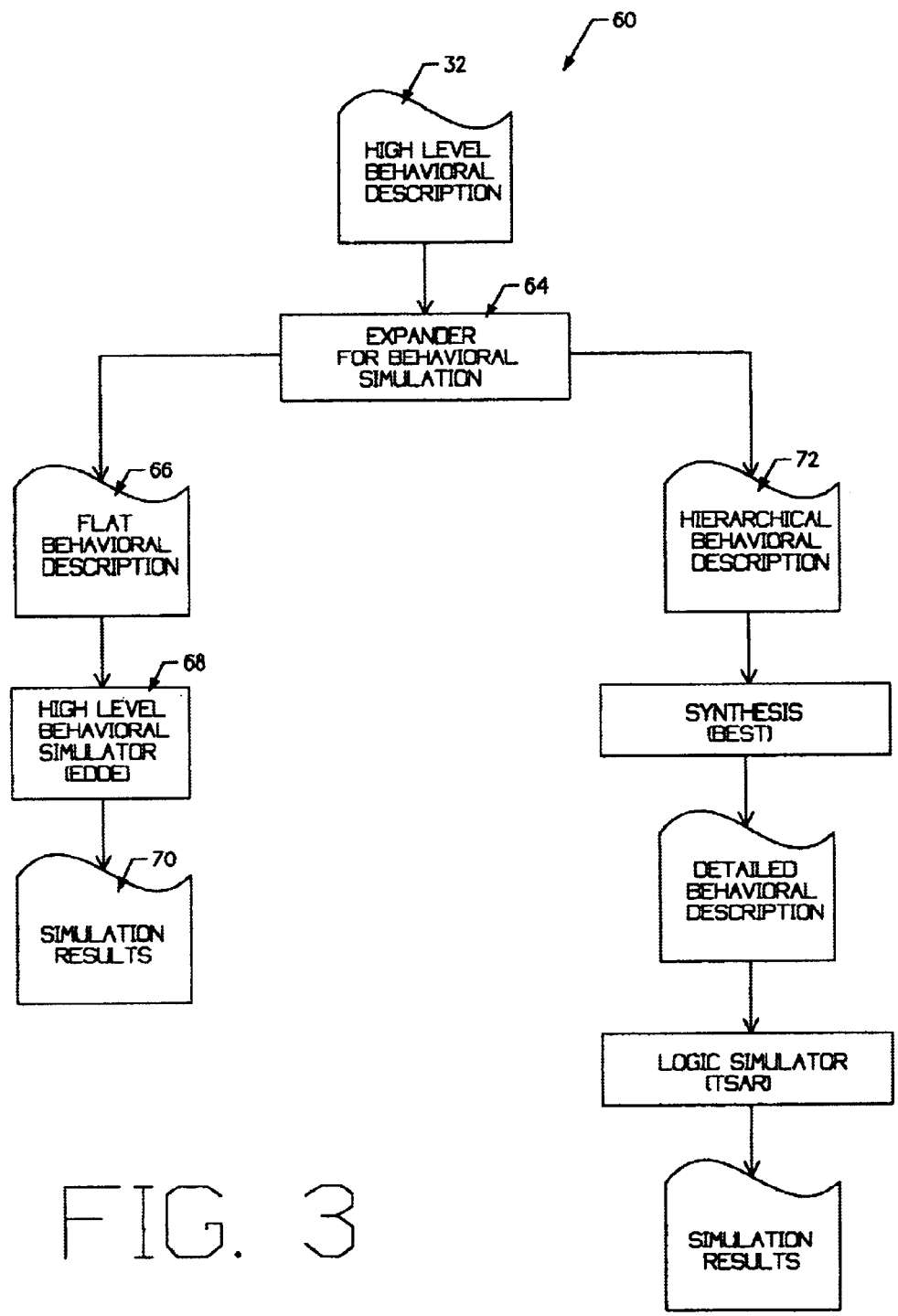
FIG. 3 is a flow diagram showing an illustrative simulation process for a circuit design.

FIG. 3 is a flow diagram showing an illustrative simulation process for a circuit design. The diagram is generally shown at 60. A high level behavioral description 32 is provided which includes a number of template calls. The high level behavioral description 32 is provided to an expander preprocessor, as shown at 64. In a preferred embodiment, the expander preprocessor has the capability of selectively providing modularity and/or hierarchy to the behavioral description.

In the flow diagram shown in FIG. 3, the expander preprocessor expands the behavioral description for behavioral simulation. This includes incorporating the corresponding template behavioral descriptions directly into the high level behavioral description 62 of the circuit design. Some simulators, for example the EDDE simulator, are not compatible with modular behavioral descriptions. Other simulators, for example the TSAR simulator, are compatible with modular behavioral descriptions. Thus, it is contemplated that the expander preprocessor 64 has the capability for selectively providing modularity and/or hierarchy to the high level behavioral description 62.

In the first case, the expander preprocessor 64 provides a non-modular (e.g. flat) behavioral description 66. The non-modular behavioral description is then provided to the high level behavioral simulator (EDDE) 68. The EDDE simulator simulates the non-modular behavioral description 66, and provides simulation results 70.

In the second case, the expander preprocessor 64 provides a modular (e.g. hierarchical) behavioral description 72. The modular behavioral description 72 is then provided to a logic synthesizer tool, such as BEST. The logic synthesizer 74 provides a detailed behavioral description 76. The detailed behavioral description may then be provided to a logic simulator such as TSAR, as shown at 78. The TSAR simulator simulates the detailed behavioral description 76, and provides simulation results 80.

As can be seen from the foregoing, the expander preprocessor 64 may provide either a modular or non-modular behavioral description, depending on the desired characteristics of the tool that is to be used. As discussed in more detail below, this is preferably accomplished by using template markers to identify the incorporated template behavioral descriptions. When hierarchy or modularity is not desired, the template markers are ignored. When hierarchy or modularity is desired, the template markers are interpreted.

Figure 4:
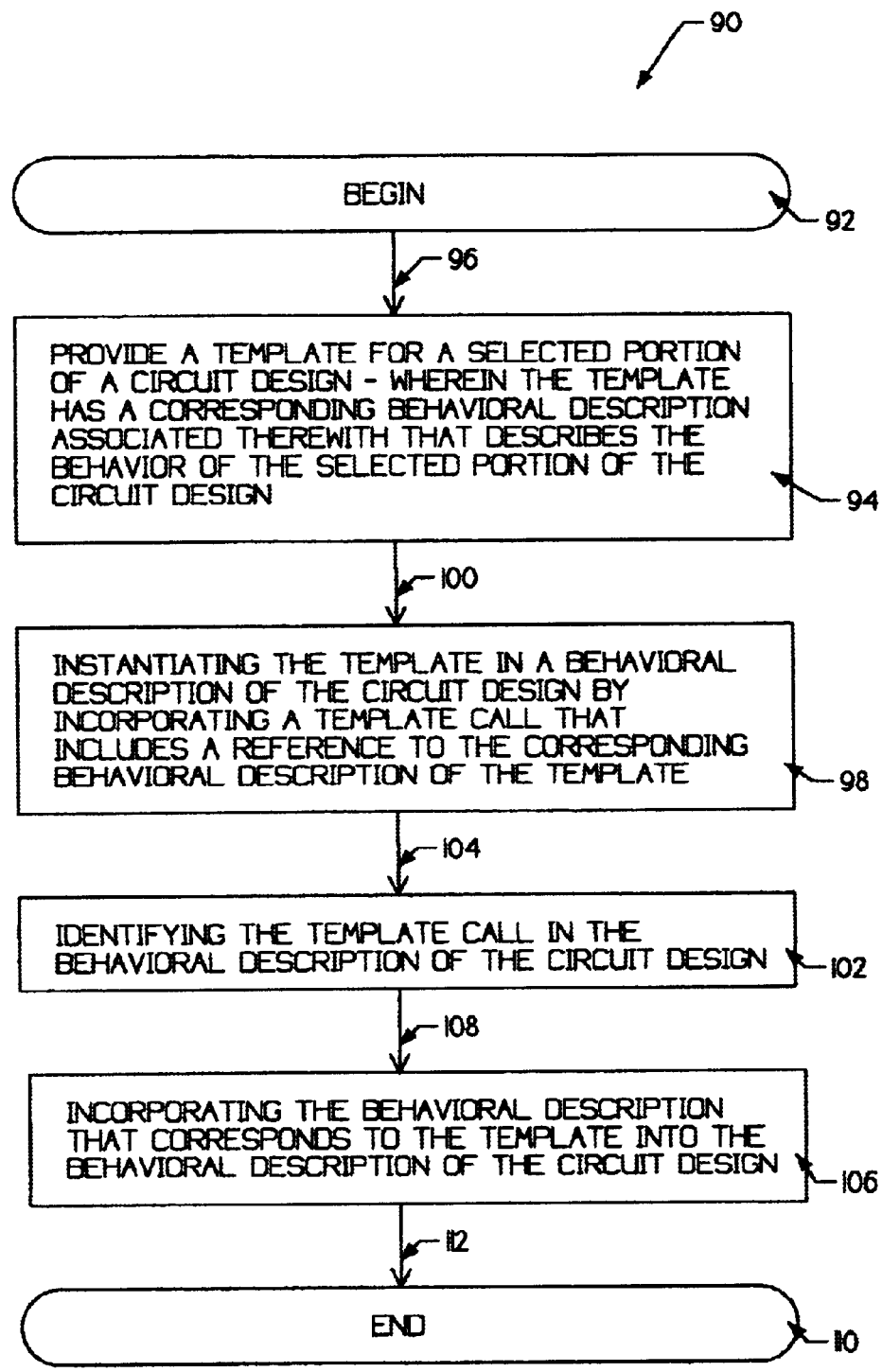
FIG. 4 is a flow diagram showing a preferred method of the present invention.

FIG. 4 is a flow diagram showing a preferred method of the present invention. The flow diagram is generally shown at 90, and is entered at block 92. Control is passed to block 94 via path 96. Block 94 provides a template to model a selected portion of the circuit design, wherein the template has a corresponding behavioral description that describes the behavior of the selected portion of the circuit design. Control is then passed to block 98 via path 100. Block 98 instantiates the template in a behavioral description of a circuit design by incorporating a template call that includes a reference to the corresponding behavioral description of the template. Control is then passed to block 102 via path 104. Block 102 identifies the template call in the behavioral description of the circuit design. Control is then passed to block 106 via path 108. Block 106 incorporates the behavioral description that corresponds to the template into the behavioral description of the circuit design. Control is then passed to block 110 via path 112, wherein the algorithm is exited.

Figure 5:
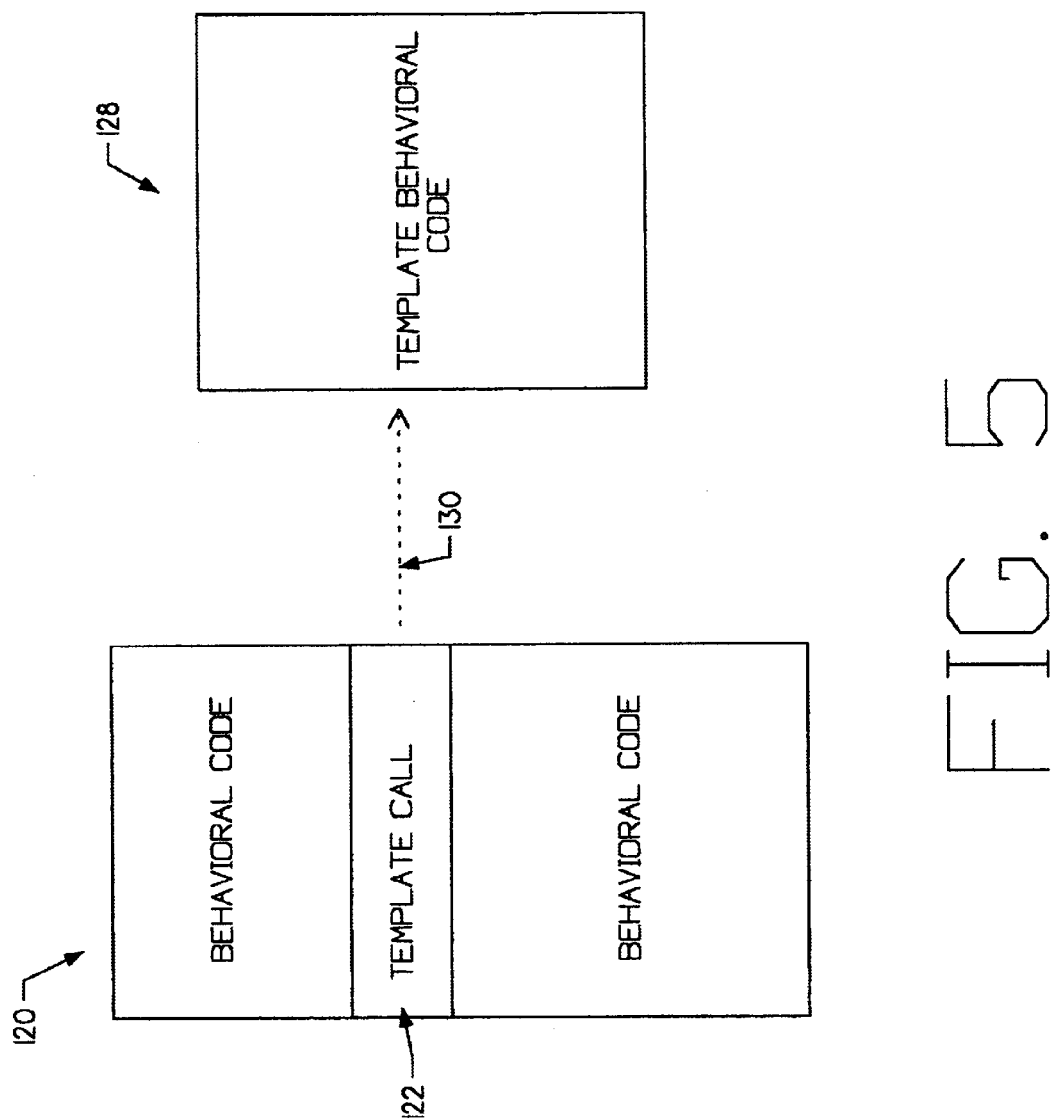
FIG. 5 is a block diagram showing an illustrative template call and the corresponding template behavioral description.

FIG. 5 is a block diagram showing an illustrative template call and the corresponding template behavioral description. A behavioral description is generally shown at 120. The behavioral description is shown as a file that is stored within a data processing system. A template call is inserted into the behavioral description, as shown at 122. The template call references a corresponding template behavioral description 128 that describes the function of the desired template, as shown at 130.

FIG. 6A is a table showing an illustrative interface section that may be provided in a template behavioral description. As indicated above, a template may include a template call which is used to instantiate a particular template in the behavioral description of the circuit design. The template may also include a corresponding template behavioral description. The template behavioral description preferably includes an interface section that corresponds to the template call. FIG. 6A shows an illustrative interface section in the template behavioral description. FIG. 6B shows a corresponding template call that is used to instantiate a particular template in the behavioral description of the circuit design.

The interface section that is provided in the template behavioral description preferably includes a directive field, a name field, a substitution parameter field, an input net parameter field, and an output net parameter field. In the illustrative embodiment, the directive field is set to #template indicating that the corresponding template behavioral description describes the function of a template, rather than a circuit design.

The name field of the interface section is typically set to a generic name for the function described by the corresponding template behavioral description. In the illustrative embodiment, the name field is set to ABC, as shown at 140. It is recognized that the name may be more descriptive of the function of the template (e.g. ADDER, ALU, AND2).

The substitution parameter field 142 of the interface section 136 includes those formal parameters that are to be substituted in the template behavioral description with those actual parameters provided in the corresponding template call used to instantiate the template in the behavioral description of the circuit design. This is discussed more fully below with reference to FIGS. 7–11.

The input net parameter field 144 and the output net parameter field 146 provide a number of generic net names used in the template behavioral description. The actual net names provided in the input 158 and output 160 net parameter fields of the corresponding template call may be substituted for the generic net names.

FIG. 6B is a table showing an illustrative template call that corresponds to the interface section of FIG. 6A. Like the interface section in the template behavioral description, the template call preferably includes a directive field, an name field, a substitution parameter field, an input net parameter field, and an output net parameter field.

In the illustrative embodiment, the directive field is set to #expand, indicating that a template is being instantiated, and should be expanded by the expander preprocessor. The name field typically identifies the corresponding template behavioral description. This is preferably done by referencing the appropriate instance name value provided in a corresponding interface section of a template behavioral description (e.g. see ABC in FIG. 6A). In addition, the name field provides a unique instance name for the particular template instantiation. For example, the name field of the template call 150 identifies the template behavioral description shown in FIG. 6A by referencing the instance name ABC provided in the name field of the interface section 136. Further, the name field provides a unique instance name for the particular template instantiation by specifying a unique instance name, for example instance name ABC0.

The substitution parameter field 156 corresponds to the substitution parameter field 142 of the interface section 136.

As will be discussed in more detail with reference to FIGS. 7–11, the substitution parameters 156 in the template call are substituted for the corresponding substitution parameters specified in the substitution parameter field of the interface section 136. This provides unique internal signal and net names within each instantiation of a template.

The input net parameter field 158 corresponds to the input net parameter field 144 of the interface section 136. The input net parameter field 158 provides the input net names within the behavioral description of the circuit design that are connected to the inputs of the particular template instantiation. Like the substitution parameter fields, the input net parameters 158 in the template call are substituted for the corresponding input net parameters specified in the input net parameter field of the interface section 136. This allows for unique input net names for each instantiation of the template.

Finally, the output net parameter field 160 corresponds to the output net parameter field 146 of the interface section 136. The output net parameter field 160 provides the output net names within the behavioral description of the circuit design that are connected to the outputs of the particular template instantiation. Like the substitution parameter field and the input net parameter field, the output net parameters 160 in the template call 150 are substituted for the corresponding output net parameters specified in the output net parameter field of the interface section 136. This provides unique output net names for each instantiation of the template.

FIG. 7 shows an illustrative template behavioral description 160 for the template call of FIGS. 6A–6B, and two template instantiations therefor. The template behavioral description includes an interface section 136 and a body section 162. The body section includes a number of internal parameters therein, for example $A and %Z, which correspond to the substitution parameters in the interface section 136. Likewise, the body section includes a number of input and output parameters, for example glock1 and Hneta, which correspond to the input and output parameters in the interface section 136.

The template instantiations 150 and 164 are typically placed in a behavioral description of a circuit design to instantiate an instance of the template behavioral descriptions. Each of the template instantiations 150 and 164 include a reference to the instance name of the interface section 136 of the template behavioral description. For example, both template instantiations 150 and 164 includes references to instance name ABC, which corresponds to the instance name specified in the interface section 136. Further, the template instantiations 150 and 164 provide a unique instance name for each instantiation. For example, the template instantiation 150 provides an instance name of ABC0, and the template instantiation 164 provides an instance name of ABC1.

In addition to the above, the template instantiations include substitution parameters that correspond to the substitution parameters of the interface section 136. For example, the template instantiation 150 includes substitution parameters "a" and "0". The substitution parameter "a" corresponds to the substitution parameter "$A" of the interface section 136, and the substitution parameter "0" corresponds to the substitution parameter "%Z" of the interface section 136. When expanded by the expander preprocessor, the substitution parameters provided in the template instantiation 150 are substituted for the corresponding internal parameters in the body section 162 of the template behavioral description 160.

Finally, the template instantiations 150 and 164 include input and output net parameters. Like the substitution parameters, the expander preprocessor substitutes the input and output net parameters in the template instantiations for the corresponding internal input and output net parameters in the body section 162 of the template behavioral description 160.

FIG. 8 shows the illustrative template behavioral description of FIG. 7 after the expander preprocessor has substituted the parameters specified in the first template instantiation. In the example shown, the expander preprocessor reads the behavioral description of the circuit design, identifies the template instantiations, reads the corresponding template behavioral description, replaces the corresponding parameters, and replaces the template instantiations with the resulting expanded behavioral description. The substitution parameters (formal parameters) listed in the interface section of the template behavioral description are replaced with the substitution parameters (actual parameters) listed in the template instantiation commands.

Referring specifically to FIGS. 7–8, the gclock1 formal parameter in the body section 162 of the template behavioral description 160 is replaced with the corresponding "ph1w" parameter listed in the template instantiation 150, as shown at 172. Likewise, the $A formal parameter in the body section 162 of the template behavioral description 160 is replaced with the corresponding "a" substitution parameter listed in the template instantiation 150, as shown at 176. Finally, the %Z formal parameter in the body section 162 of the template behavioral description 160 is replaced with the corresponding "0" substitution parameter listed in the template instantiation 150, as shown at 178 and 180. Preferably, the character replacement is straight text substitution, while the numeric replacement may use arithmetic operations. An example of an arithmetic operation is shown at 174 by the substitution of %(Z+1) with the value "1".

Figure 9:
FIG. 9 shows an illustrative repeat command for providing multiple instances of a template.

FIG. 9 shows an illustrative repeat command for providing multiple instances of a template. The repeat command shown at 190 operates in a similar manner as described above, but includes a number of loops. During each loop, a template is instantiated using the parameters that are provided by the repeat commands. The illustrative code produces 36 module instantiations, including modules AA[0 ... 11], AB[0 ... 11], AC[0 ... 11], using the signals Hnet0[0 ... 11], Hnet1[0 ... 11] and Hout0_d[0 ... 11]. The repeat command provides an efficient way for instantiating multiple instances of a template.

FIG. 10 shows an illustrative template behavioral description having nested template instantiations. Note that the template behavioral description "E", shown generally at 201, includes two template instantiation commands referencing template "D", as shown at 202. In the behavioral description of the circuit design, a template call instantiates template "E1", as shown at 204. When the expander preprocessor expands the template behavioral description for instance "E1", the template instantiations for instances "D1" and "D2" are likewise expanded. As can readily be seen, only the template instantiations for the top most module is provided in the behavioral description of the circuit design. As the behavior is expanded by the expander preprocessor, hierarchy and variables are created. This may provide an efficient way for nesting template instantiations.

FIG. 11 shows the illustrative template behavioral description of FIG. 10 after expansion by the expansion preprocessor. As indicated above, the expander preprocessor incorporates the expanded behavior for instance "D1" into the expanded behavioral description of instance "E1". As shown in FIG. 11, the expanded behavior for instance "E1" begins at 212 and ends at 214. The expanded behavior for instance "D1" is incorporated into the expanded behavior for instance "E1", as shown at 216.

Figure 12:
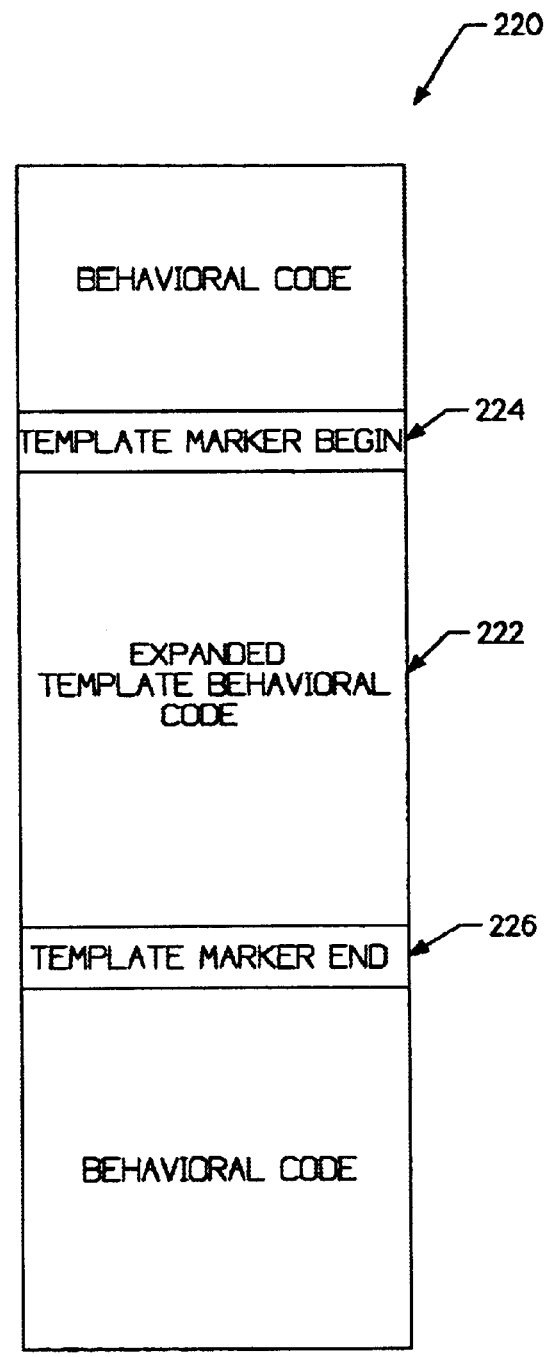
FIG. 12 shows an illustrative behavioral description after expansion, with template markers positioned both before and after the incorporated template behavioral code.

FIG. 12 shows an illustrative behavioral description after expansion, with template markers positioned both before and after the incorporated template behavioral code. The resulting behavioral description is generally shown at 220, and is typically stored in a file. A first template marker 224 may be provided at the beginning of the expanded template behavioral code 222. A second template marker 226 may be provided at the end of the expanded template behavioral code 222. As discussed more fully below with reference to FIGS. 14–15, these template markers may be used by design process tools to selectively provide hierarchy and/or modularity to the circuit design database. For those tools that cannot directly read hierarchical behavioral descriptions, the template markers are ignored. For those tools that can directly read hierarchical behavioral descriptions, the template markers are interpreted, and a hierarchical module corresponding to the template is provided.

For example, a logic synthesizer tool may use the template markers to selectively incorporate hierarchy and/or modularity into the synthesized detailed description of the circuit design. Thereafter, a manual placement tool may be used to interpret the modularity and/or hierarchy provided in the detailed description, and provide a mechanism for sharing placement information between selected instances. Using this approach, a circuit designer may place the contents of one instance of a module using the manual placement tool, with the components of all other instances of that module being automatically placed by simply referencing the common placement information. This may significantly reduce the time required to place a circuit design.

Figure 13:
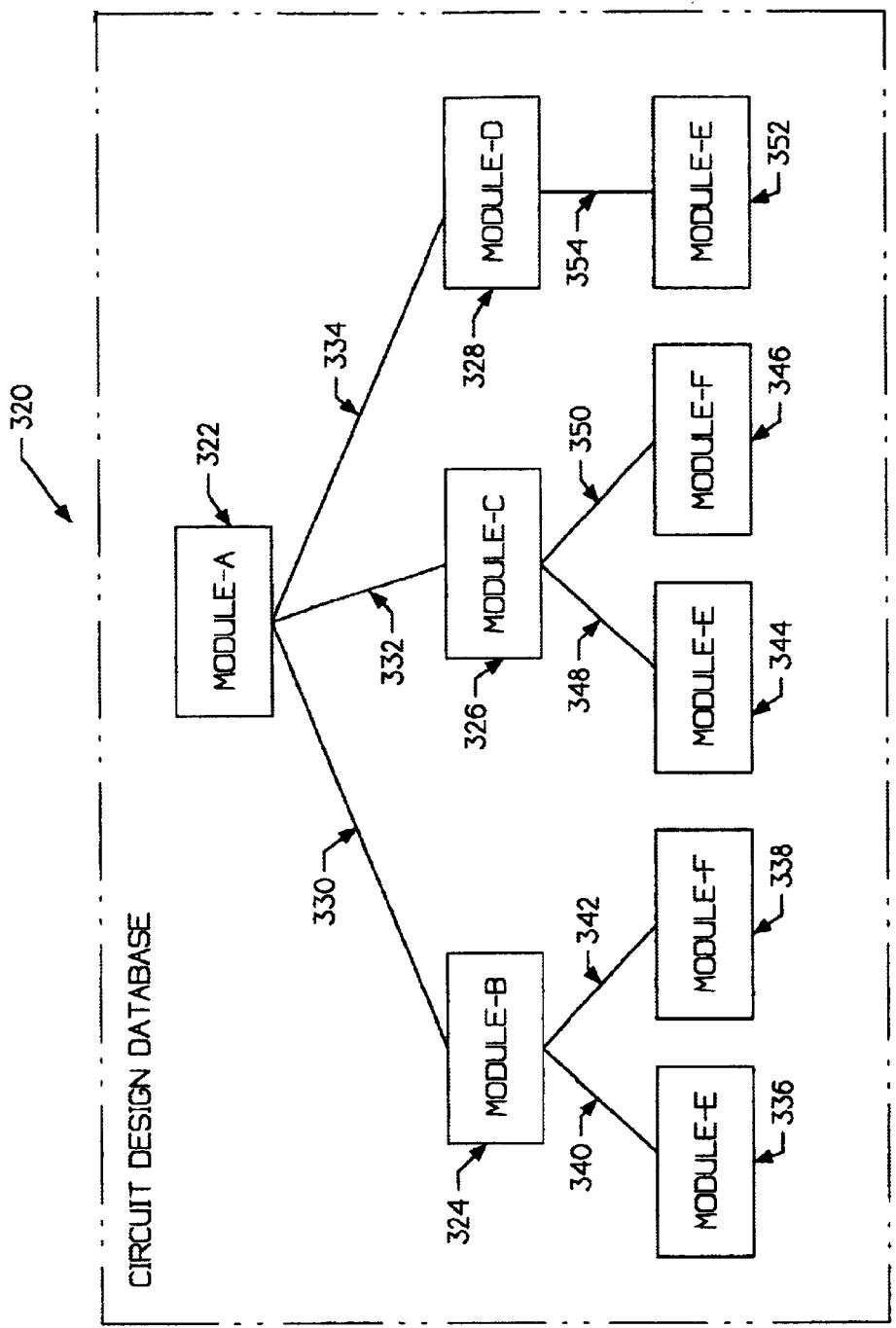
FIG. 13 is a block diagram showing a typical circuit design hierarchy, including a number of hierarchical circuit modules.

FIG. 13 is a block diagram showing a typical circuit design hierarchy, including a number of hierarchical circuit modules. The diagram is generally shown at 320. A top level module-A 322 is provided, and may represent the top hierarchial level in the exemplary circuit design database. Module-A 322 may include references to module-B 324, module-C 326, and module-D 328 as shown at 330, 332 and 334, respectively. Module-B 324, module-C 326, and module-D 328 represent the next lower level of design hierarchy in the circuit design database.

Module-B 324 may include references to module-E 336 and module-F 338 as shown at 340 and 342, respectively. Similarly, module-C 326 may include references to module-E 344 and module-F 346, as shown at 348 and 350, respectively. Finally, module-D 338 may include a reference to module-E 352, as shown at 354. Modules 336, 338, 344, 346 and 352 represent the lowest level in the design hierarchy of the circuit design database, and may be "leaf cells". That is, modules 336, 338, 344, 346 and 352 may be components from a vendor provided cell library.

It is noted that the same module, for example module-E, may be referenced by module-B 324, module-C 326, and module-D 328. To distinguish module-E 336, module-E 334 and module-E 342 from one another, a unique instance name may be provided, thereby allowing each module to be uniquely identified. Similarly, module-F 338 and module-F 346 may be provided with a unique instance name.

It is recognized that in practice, the circuit design database is typically much more complex, containing many more levels of design hierarchy and thousands of modules and/or cells. That is, the circuit design database shown in FIG. 13 is only presented to illustrate the basic structure of a typical circuit design database.

Figure 14:
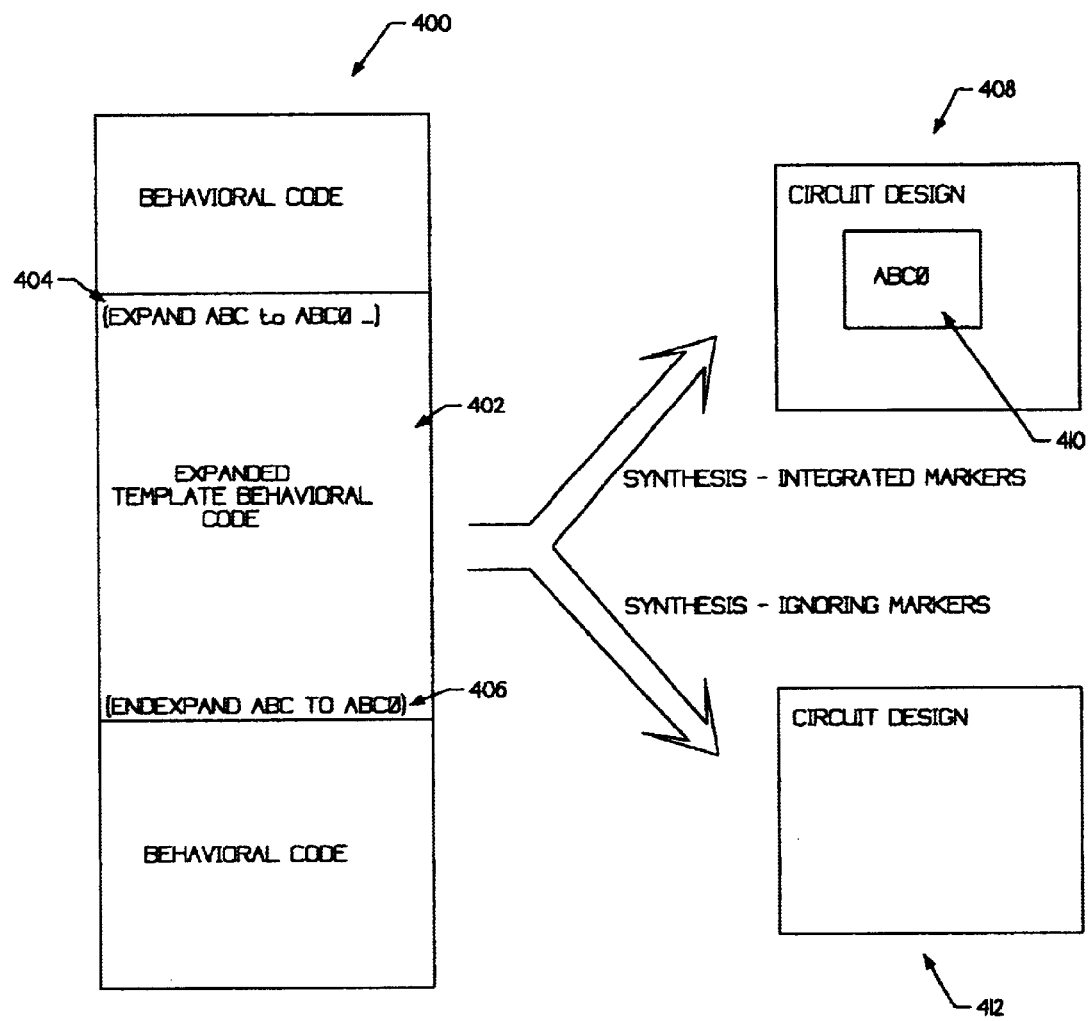
FIG. 14 is a block diagram showing illustrative logic synthesis of a behavioral description with template markers therein.

FIG. 14 is a block diagram showing illustrative logic synthesis of an expanded behavioral description with template markers therein. The expanded behavioral description is generally shown at 400. The expanded behavioral description 400 incorporates expanded template behavioral code 402. As discussed with reference to FIG. 12, the expander preprocessor may place a template marker 402 at the beginning of the expanded template behavioral code 402, and may further place a second template marker 406 at the end of the expanded template behavioral code 402.

Selected design process tools may then read the expanded behavioral description 400, and selectively provide modularity and/or hierarchy to a resulting detailed description. Continuing with the above example, a logic synthesizer may provide modularity and/or hierarchy to the resulting detailed description by interpreting the template markers 404 and 406, and including the resulting synthesized logic of the expanded template behavioral code within a hierarchical module. For example, by recognizing the template markers 404 and 406, the logic synthesizer may incorporate the synthesized logic that results from synthesizing the expanded template behavioral code of template ABC0 into a hierarchical module 410.

Likewise, the logic synthesizer may provide a non-modular detailed description by ignoring the template markers 404 and 406. In this case, the resulting synthesized detailed description may be effectively flat and/or non-modular, as shown at 412. As can readily be seen, design process tools may selectively provide modularity and/or hierarchy to the circuit design by either interpreting or ignoring the template markers provided in the expanded behavioral description 400.

Figure 15:
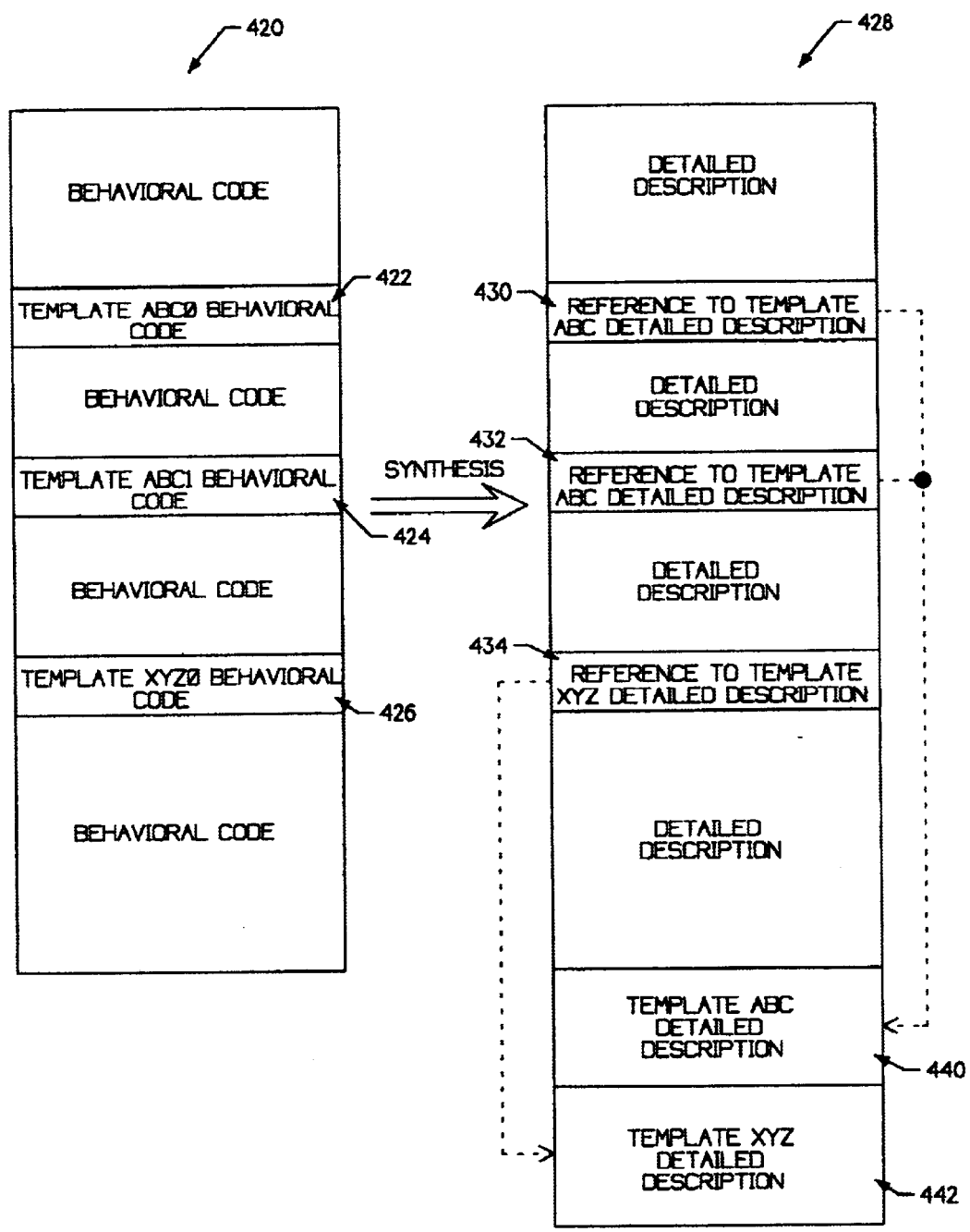
FIG. 15 is a block diagram showing an illustrative logic synthesis of a behavioral description, wherein the synthesized templates include references to a common template module.

FIG. 15 is a block diagram showing an illustrative logic synthesis of a behavioral description, wherein the synthesized templates include references to a common template module. An expanded behavioral description is generally shown at 420, and a resulting synthesized detailed description is generally shown at 428. The expanded behavioral description 420 incorporates a number of expanded template behavioral descriptions 422, 424 and 426. In the illustrative embodiment, the first two expanded behavioral descriptions are instances of a common template. That is, the expanded behavioral description 422, having an instance name of ABC0, is expanded from a template having a formal instance type of ABC. Likewise, the expanded behavioral description 424, having an instance name of ABC1, is also expanded from the template having a formal instance type of ABC. In contrast, the expanded behavioral description 426, having an instance name of XYZ, is expanded from a template having a formal instance type of XYZ.

It is contemplated that the expander preprocessor may create a dummy module when it encounters the first expansion of a given template. This dummy module may be used by a logic synthesizer to generate a common placement module for inclusion in the placement database. During manual placement, each instance of a given template may reference the common placement module, and the manual placement tool may provide a mechanism for sharing the placement information between selected instances. Using this approach, a circuit designer may place one instance of a module using the manual placement tool, and all other instances of that module may be automatically placed. This may significantly reduce the time required to place a circuit design.

It is contemplated that the logic synthesizer may synthesize only one of the common template instances 422 and 424, and provide a common detailed description 440 therefor. The logic synthesizer may skip over all other instances of the template, and process only the interface sections thereof to define the interconnect of the particular instances. Thus, each of the instances 430 and 432 that share a common template source may share the resulting detailed description 440. That is, because a number of instances may share the same behavioral description, the common behavioral description may be synthesized once, and the resulting detailed description may be shared. This is particularly useful when the common behavioral description does not include any internal nets or variables that will conflict with other instances of the same module (for example, an AND2 gate). It is recognized that the interface section of each instance of the module may have to be processed to define unique interconnect of each instance to the overall circuit design. However, this may still reduce the time required to synthesize the overall behavioral description of the circuit design. In contrast, and in non-modular databases, the behavioral description for each identical module must be independently synthesized into a number of corresponding detailed descriptions.

Finally, it is contemplated that the logic synthesizer may independently generate a corresponding detailed description for each template instantiation 422, 424 and 426. Thus, the logic synthesizer may also provide an essentially flat detailed description of the circuit design (not shown).

Figure 16:
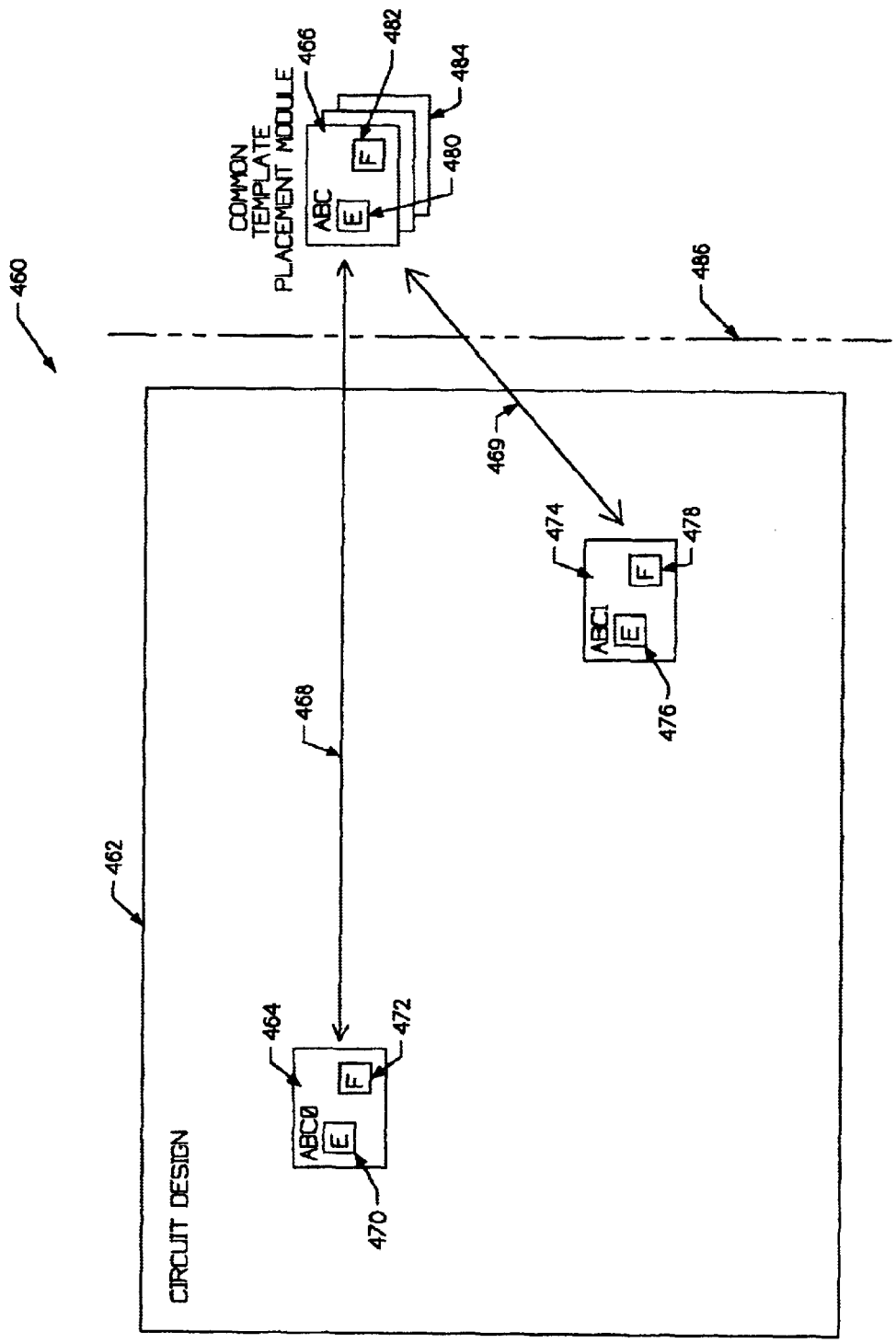
FIG. 16 is a block diagram showing the manual placement of the synthesized detailed description of FIG. 15.

FIG. 16 is a block diagram showing the manual placement of the synthesized detailed description of FIG. 15. The placement of the circuit design is generally shown at 460. As described above, it is contemplated that the expander preprocessor may create a dummy module when it encounters a first expansion of a given template. This dummy module may be used by a logic synthesizer to generate a common placement module for inclusion in the placement database. This common placement module is shown at 466, and may include a number of different versions, as shown at 484. The actions taking place within the manual placement tool are shown to the left of the dashed line 486, the placement design database is shown to the right of the dashed line 486.

Because each instance of a given template may reference the common placement module 466, the manual placement tool may provide a mechanism for sharing the placement information between selected instances, as shown by lines 468 and 469. This mechanism may be as simple as allowing multiple instances to reference the same portion of the placement database. Using this approach, a circuit designer may place one instance, for example instance 464, at a selected location within the circuit design 462. The circuit designer may then place those modules that are referenced by that instance, for example module-E 470 and module-F 472. The placement of module-E 470 and module-F 472 may be stored in the common placement module 466.

The circuit designer may then place a second instance, for example instance 474, at a selected location within the circuit design 462. Since the first instance 464 and the second instance 474 reference the same common placement module 466 in the placement database, module-E 476 and module-E 478 may be automatically placed within the second instance having the same relative placement locations, as shown. It is contemplated that the placement information within one of the two instances may be changed without affecting the placement of the other instance by providing another version 484 of the common placement module 466.

Figure 17:
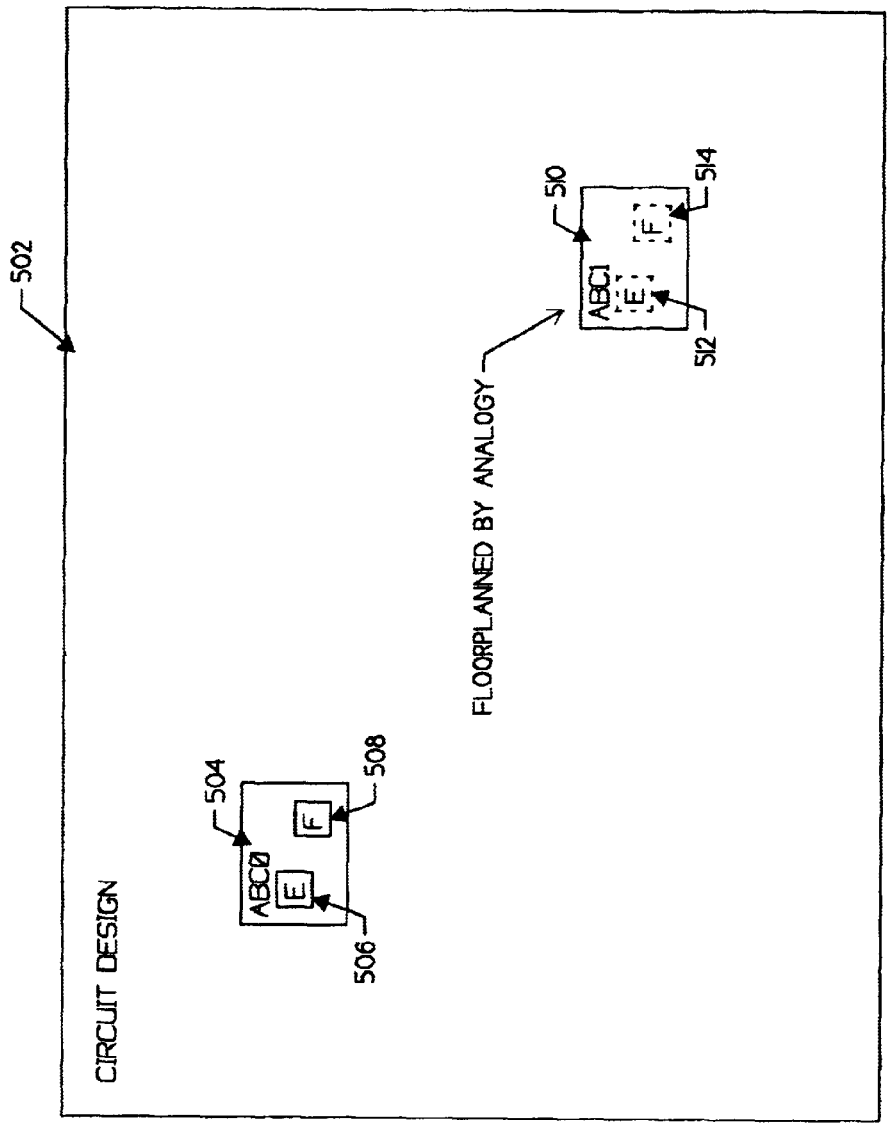
FIG. 17 is a block diagram showing the manual placement of the synthesized detailed description of FIG. 15 using a floorplanning by analogy algorithm.

FIG. 17 is a block diagram showing the manual placement of the synthesized detailed description of FIG. 15 using a floorplanning by analogy algorithm. This approach does not require that the two instances ABC0 504 and ABC1 510 share a common placement module or database. The placement of the circuit design is generally shown at 502. The circuit designer may place instance ABC0 504, and those instances within instance ABC0 504 including module-E 506 and module-F 508. Then, the circuit designer may place instance ABC1 510 at the location shown. The placement of module-E 512 and module-F 514 may be done using a floorplan by analogy algorithm. In a general sense, the floorplan by analogy algorithm duplicates the placement of module-E 506 and module-F 508 relative to instance ABC0, and provides the same placement of module-E 512 and module-F 514 relative to instance ABC1. A further discussion of the floorplan by analogy algorithm can be found in U.S. patent application Ser. No. 08/414,881, entitled "A Method for Placing Logic Functions and Cells in a Logic Design Using Floor Planning by Analogy", which is incorporated herein by reference. This approach may substantially reduce the time and effort to manually place selected cells of a circuit design.

Figure 18:
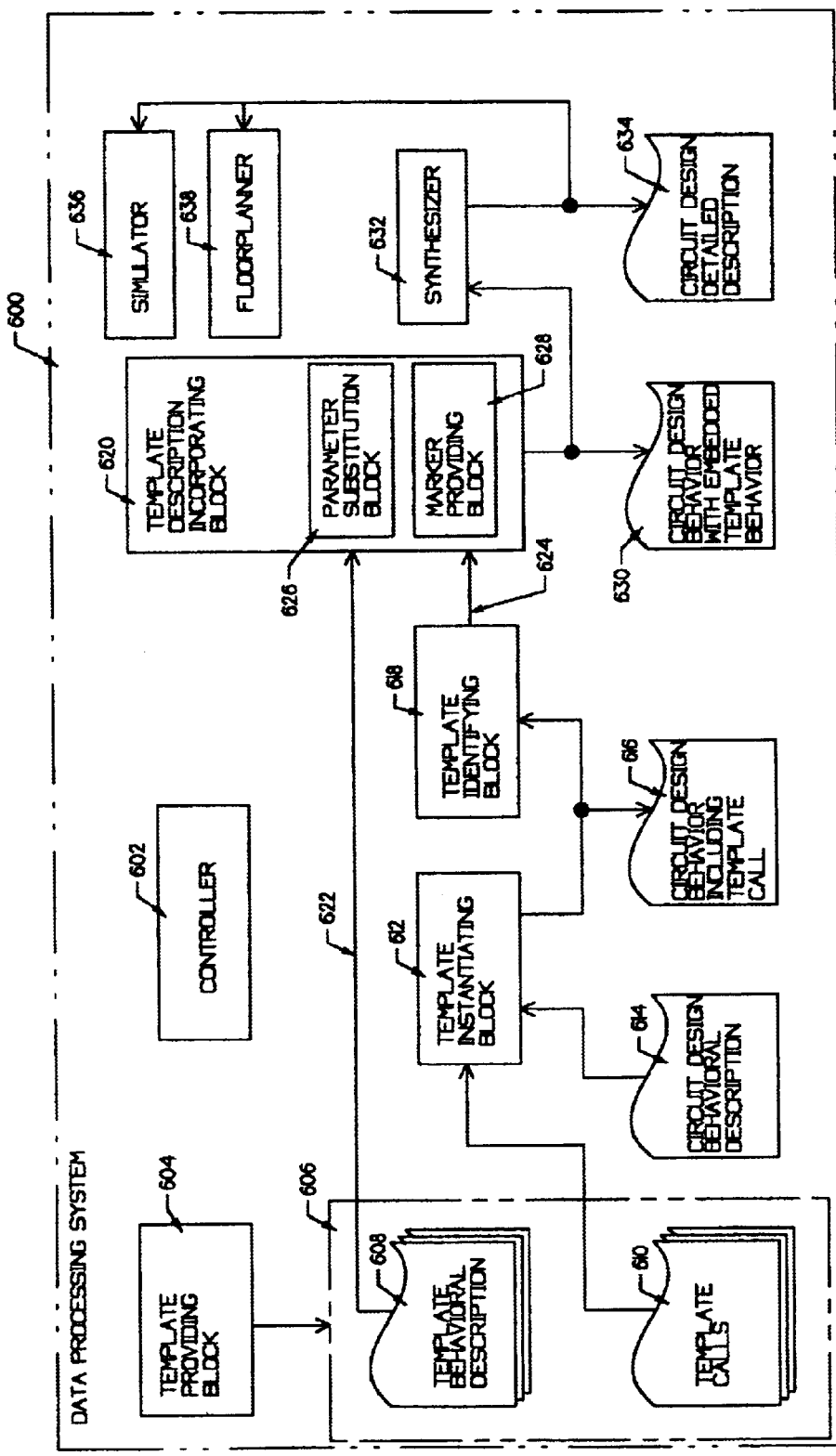
FIG. 18 is a block diagram showing an exemplary data processing system in accordance with the present invention.

FIG. 18 is a block diagram showing an exemplary data processing system in accordance with the present invention. The data processing system is generally shown at 600, and is controlled by a controller 602. A template providing block 604 provides a number of template behavioral descriptions 608 and a number of template calls 610, as shown. Each template call has a corresponding template behavioral description.

Selected ones of the template calls 610 are provided to a template instantiating block 612. The template instantiating block reads the behavioral description 614 of the circuit design, and includes the template calls therein at selected locations. Each of the template calls instantiate at least one template component in the behavioral description of the circuit design.

The template instantiating block 612 provides a behavioral description with a number of template instantiations therein, as shown at 616. A template identifying block 618 reads the resulting behavioral description and identifies the template instantiations therein. The result is provided to a template description incorporating block, preferably implemented as a expander preprocessor. The template description incorporating block 620 reads the template behavioral descriptions 608, and incorporates those template behavioral descriptions that correspond to the template calls identified by the template identifying block 618. For each template call, a parameter substitution block 626 substitutes selected actual parameters provided by the template call for selected formal parameters in a corresponding template behavioral description. Further, a marker providing block 628 may mark the beginning and end of the incorporated behavioral description.

The result is a behavioral description with embedded template behavioral code, as shown at 630. A logic synthesizer block 632 synthesizes the behavioral description 630, and provides a detailed description 634 of the circuit design. As described above, the logic synthesizer block 632 may selectively provide hierarchy to the detailed description. The detailed description 634 is then provided to a simulator block 636, which may logically simulate the detailed description 634. Also, the detailed description 634 is provided to a floorplanner block 638, wherein selected portions of the detailed description may be manually placed.

Having thus described the preferred embodiments of the present invention, those of skill in the art will readily appreciate that the teachings found herein may be applied to yet other embodiments within the scope of the claims hereto attached.

What is claimed is:

1. A method for providing a behavioral description of a circuit design, the method comprising the steps of:
   a. providing a template behavioral description, wherein the template behavioral description models a selected portion of the circuit design;
   b. instantiating a number of template calls in the behavioral description of the circuit design by incorporating the template call into the behavioral description of the circuit design a number of times, thereby resulting in a number of template instantiations, each of the template instantiations including a reference to the corresponding template behavioral description;
   c. identifying the template calls in the behavioral description of the circuit design that correspond to each of the template instantiations;
   d. incorporating the behavioral description that corresponds to each of the template instantiations into the behavioral description of the circuit design;
   e. wherein the behavioral description of the circuit design is stored in a file, and each of the template calls is positioned at a selected location in the file;
   f. wherein said incorporating step (d) incorporates the template behavioral description at the selected locations in the file that correspond to the template calls;
   g. wherein said incorporating step 18(d) further includes the step of providing a template marker at each of the selected locations in the file that correspond to the template calls;
   h. synthesizing the behavioral description of the circuit design into a hierarchical detailed description of the circuit design;
   i. wherein said synthesizing step results in a number of hierarchical elements, wherein each of the number of hierarchical elements corresponding to one of the template instantiations;
   j. wherein each of the number of hierarchical elements implements the template behavioral description, and results in a hierarchical detailed description;
   k. wherein at least a first and second one of the number of hierarchical elements reference a common placement database;
   l. wherein the first one of the hierarchical elements is placed using a floorplanning tool;
   m. wherein the first one of the hierarchical elements includes a number of sub-elements;
   n. wherein selected ones of the number of sub-elements of the first one of the hierarchical elements are placed using the floorplanning tool, and the common placement database is updated to reflect the placement of the sub-elements of the first one of the hierarchical elements;
   o. placing the second one of the hierarchical elements;
   p. wherein the second one of the hierarchical elements includes a number of sub-elements, whereby the number of sub-elements of the second one of the hierarchical elements are located at the same relative position as the sub-elements of the first one of the hierarchical elements because the second one of the hierarchical elements references the updated common placement database.

2. A method according to claim 1 further including the step of modifying the placement of the number of sub-elements of the second one of the hierarchical elements by creating another version of the updated common placement database.

3. A method according to claim 1 wherein at least a third and fourth one of the number of hierarchical elements reference different placement databases.

4. A method according to claim 3 wherein the first one of the hierarchical elements of the hierarchical detailed description is placed using a floorplanning tool.

5. A method according to claim 4 wherein the first one of the hierarchical elements includes a number of sub-elements.

6. A method according to claim 5 wherein selected ones of the number of sub-elements of the first one of the hierarchical elements are placed using the floorplanning tool.

7. A method according to claim 6 further including the step of placing the second one of the hierarchical elements.

8. A method according to claim 7 wherein the second one of the hierarchical elements includes a number of sub-elements.

9. A method according to claim 8 further comprising the step of placing the number of sub-elements of the second one of the hierarchical elements at the same relative placement locations as the number of sub-elements of the first one of the hierarchical element by using a floorplan by analogy tool.

* * * * *